United States Patent
Tsai et al.

(10) Patent No.: US 11,411,655 B2
(45) Date of Patent: Aug. 9, 2022

(54) OPTICAL RECEIVING DEVICE

(71) Applicant: Molex, LLC, Lisle, IL (US)

(72) Inventors: Kuen-Ting Tsai, Tainan (TW); Yao-Wen Liang, Hsinchu (TW); Zuon-Min Chuang, New Taipei (TW); Wei-Hung Chen, New Taipei (TW)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 17/329,211

(22) Filed: May 25, 2021

(65) Prior Publication Data

US 2021/0376934 A1 Dec. 2, 2021

(30) Foreign Application Priority Data

May 27, 2020 (CN) .......................... 202010460144.0

(51) Int. Cl.
*H04B 10/69* (2013.01)
(52) U.S. Cl.
CPC .............................. *H04B 10/6931* (2013.01)
(58) Field of Classification Search
CPC .. H03G 3/3084; H04B 10/673; H04B 10/693; H04B 10/6931
USPC .................................................. 398/202–212
See application file for complete search history.

(56) References Cited

U.S. PATENT DOCUMENTS

| | | | | |
|---|---|---|---|---|
| 5,015,839 | A | * | 5/1991 | Tanikoshi .......... H04B 10/6931 250/214 AG |
| 5,710,660 | A | * | 1/1998 | Yamamoto .......... H01S 3/13013 398/178 |
| 5,953,690 | A | | 9/1999 | Lemon et al. |
| 6,304,357 | B1 | | 10/2001 | Ohhata et al. |
| 7,924,499 | B2 | | 4/2011 | Inagaki et al. |
| 7,974,337 | B2 | | 7/2011 | Momtaz et al. |
| 8,553,319 | B2 | | 10/2013 | Sugaya et al. |
| 2002/0080475 | A1 | * | 6/2002 | Cornelius ............ H04B 10/675 359/341.41 |
| 2002/0196510 | A1 | * | 12/2002 | Hietala ................ H04L 27/367 398/202 |

(Continued)

FOREIGN PATENT DOCUMENTS

TW 201505387 A 2/2015

OTHER PUBLICATIONS

Yan et al; An Optical Receiver with Automatic Gain Control for Radio-over-Fiber System; 2011; IEEE; pp. 1-2. (Year: 2011).*

(Continued)

*Primary Examiner* — Amritbir K Sandhu

(57) ABSTRACT

An optical receiving device includes a conversion module, a signal generation module and a control module. The conversion module performs photoelectric conversion and amplification on an optical signal to generate a photocurrent, the signal generation module provides a gain signal, performs transimpedance and amplification on the photocurrent according to an input signal indicating a preset output voltage swing to generate a voltage signal, and generates a measurement signal indicating an average optical power associated with the optical signal according to the photocurrent, the control module outputs a control signal which is variable to adjust a gain of the conversion module, so that a dynamic range of the conversion module changes as the gain of the conversion module itself changes.

9 Claims, 6 Drawing Sheets

(56) References Cited

U.S. PATENT DOCUMENTS

| | | | | |
|---|---|---|---|---|
| 2005/0226640 | A1* | 10/2005 | Audie | H04B 10/67 398/202 |
| 2009/0208214 | A1* | 8/2009 | Hauenschild | H04B 10/50 398/183 |
| 2012/0045209 | A1* | 2/2012 | Boyd | H04B 10/272 398/43 |
| 2012/0212800 | A1* | 8/2012 | Nakata | H04B 10/673 359/345 |
| 2016/0087747 | A1* | 3/2016 | Way | H04J 14/0221 398/81 |
| 2016/0164624 | A1* | 6/2016 | Yamauchi | H04B 10/615 398/34 |

OTHER PUBLICATIONS

Chen et al; An optical receiver with automatic gain control for radio-over-fiber system, 2011; IEEE, pp. 1-2. (Year: 2011).*
Extended European search report and Opinion received for EP application No. 21175375.1, dated Oct. 29, 2021, 9 pages.

* cited by examiner

OPTICAL RECEIVING DEVICE

RELATED APPLICATIONS

The present application claims priority to Chinese Patent Application No. 202010460144.0 filed May 27, 2020 which is incorporated by reference in its entirety.

TECHNICAL FIELD

The present disclosure relates to a device, and particularly relates to an optical receiving device.

BACKGROUND

An existing optical communication system includes an optical transmitting device, an optical fiber, an optical receiving device, an adjustable optical attenuator, an optical splitter and an optical detector.

The optical transmitting device is used to transmit an optical signal of a multilevel pulse amplitude modulation, and transfer the optical signal to the optical splitter sequentially via the optical fiber and the adjustable optical attenuator. The optical splitter splits the received optical signal into a first optical signal and a second optical signal, and transfers the first optical signal and the second optical signal to the optical detector and the optical receiving device respectively. The optical receiving device performs photoelectric conversion, amplification and demodulation on the received second optical signal to generate a digital data output, so as to allow a post-stage digital circuit to use. The optical detector generates a measurement signal indicating an optical power of the optical signal according to the first optical signal, and transfers the measurement signal to the adjustable optical attenuator. According to the measurement signal, the adjustable optical attenuator decides whether the optical signal received via the optical fiber optical is first performed for power attenuation and adjustment and then outputted to the optical splitter so that the optical receiving device will not cause a semiconductor optical amplifier inside to be operated at a saturation region because an optical power of the second optical signal received by the optical receiving device from the optical splitter is too large, so as to avoid the digital data output generated by the optical receiving device being inaccurate because the semiconductor optical amplifier is operated at the saturation region.

As such, in addition to the basic elements, such as the optical transmitting device, the optical fiber and the optical receiving device, included by the existing optical communication system, it additionally requires the existing optical communication system to further include the adjustable optical attenuator, the optical splitter and the optical detector, which results in that the existing optical communication system has a larger volume and a higher cost. Moreover, a dynamic range of the optical receiving device associated with an inputting power of the optical signal is more limited. Therefore, the existing optical communication system still has an improved space.

SUMMARY

Therefore, an object of the present disclosure is to provide an optical receiving device which can overcome a deficiency of the existing technology.

Accordingly, an optical receiving device of the present disclosure comprises a conversion module, a signal generation module and a control module. The conversion module is used to receive an optical signal from an optical fiber and perform photoelectric conversion and amplification on the optical signal to generate a photocurrent. The signal generation module receives an input signal indicating a preset output voltage swing, and electrically connects the conversion module to receive the photocurrent, the signal generation module provides a gain signal indicating a total gain itself, and performs transimpedance and amplification on the photocurrent according to the input signal to generate a voltage signal, and generates a measurement signal indicating an average optical power associated with the optical signal according to the photocurrent. The control module electrically connects the conversion module and the signal generation module, and outputs a control signal which is variable to the conversion module to adjust a gain of the conversion module, so that a dynamic range of the conversion module changes as the gain of the conversion module itself changes.

The technical effect of the present disclosure lies in that: by that the control module generates the control signal to adjust the gain of the conversion module, the dynamic range of the conversion module may be further increased therewith, so that the transfer distance of the optical signal via the optical fiber is less limited, in turn link performance is promoted.

BRIEF DESCRIPTION OF THE DRAWINGS

Other features and technical effects of the present disclosure will be apparent in an embodiment referring to the accompanying figures, in which.

DETAILED DESCRIPTION OF THE PREFERRED EMBODIMENTS

Figure 1:
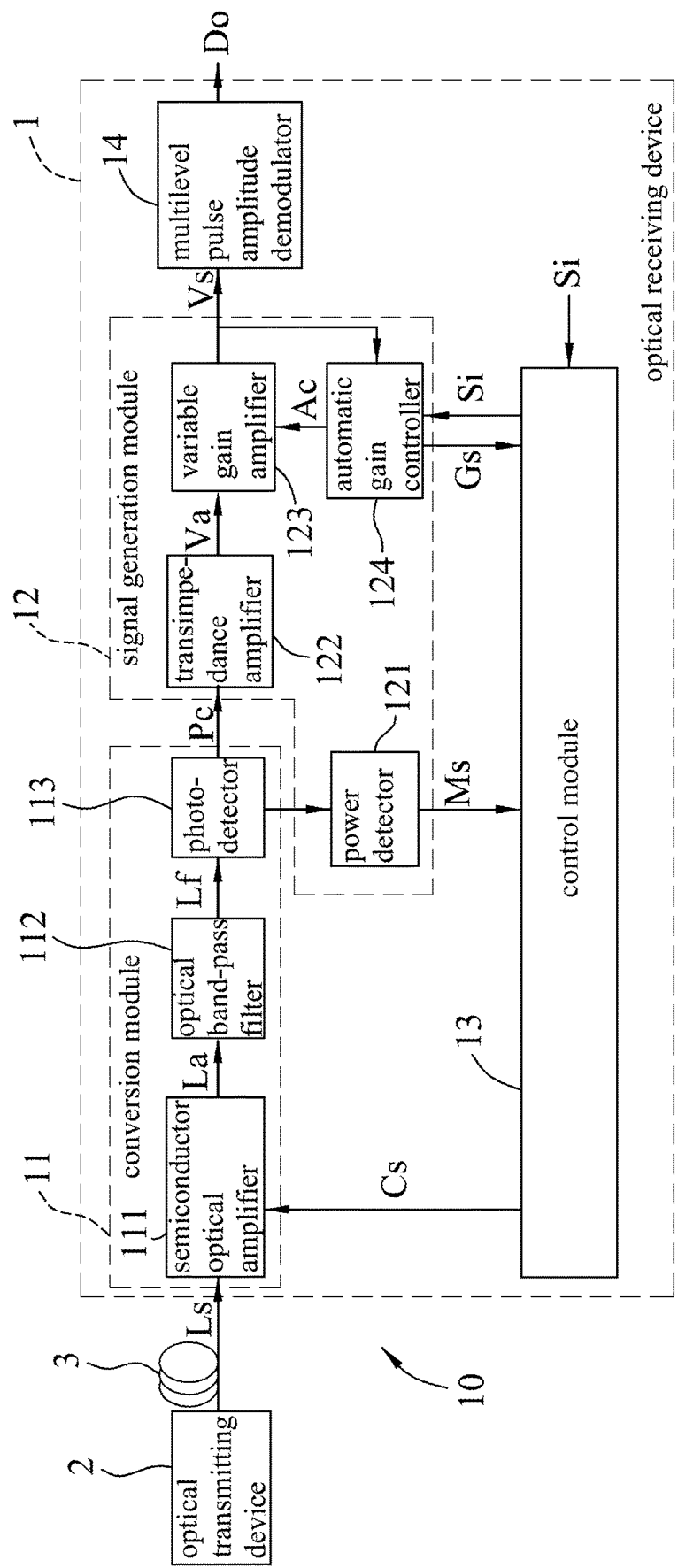
FIG. 1 is a block diagram illustrating a first embodiment of an optical receiving device of the present disclosure is used for an optical communication system.

Before the present disclosure is described in detail, it should be noted that like elements are denoted by the same reference numerals in the following description.

First Embodiment

Referring to FIG. 1, an embodiment of an optical receiving device 1 of the present disclosure is adapted to an optical communication system 10. The optical communication system 10 includes an optical transmitting device 2 and an optical fiber 3. The optical transmitting device 2 is used to transmit an optical signal Ls of a multilevel pulse amplitude modulation (PAM-N) and transfer the optical signal Ls to the optical receiving device 1 via the optical fiber 3. The optical signal Ls is an at least four level multilevel pulse amplitude modulation signal. In the present embodiment, that the optical signal Ls is a four level pulse amplitude modulation signal is taken as an example, but the present disclosure is not limited thereto.

The optical receiving device 1 of the present embodiment includes a conversion module 11, a signal generation module 12, a control module 13 and a multilevel pulse amplitude demodulator 14.

The conversion module 11 is used to receive the optical signal Ls from the optical fiber 3, and perform photoelectric conversion and amplification on the optical signal Ls to generate a photocurrent Pc. In the present embodiment, the conversion module 11 includes a semiconductor optical amplifier 111, an optical band-pass filter 112 and a photodetector/optical detector 113.

Figure 2:
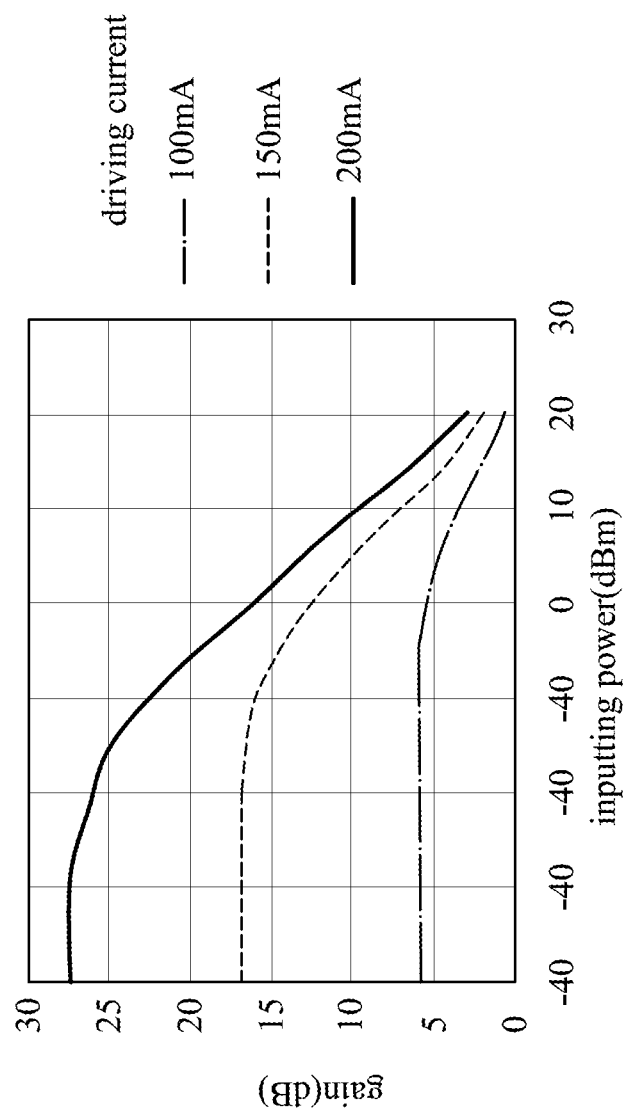
FIG. 2 is a simulation diagram illustrating a gain of a semiconductor optical amplifier of the first embodiment itself changes with an inputting power under different driving currents.

The semiconductor optical amplifier 111 is used to receive the optical signal Ls and receive a control signal Cs which is variable. The semiconductor optical amplifier 111 adjusts a gain itself according to the control signal Cs and amplifies the optical signal Ls to generate an amplified optical signal La. The gain of the semiconductor optical amplifier 111 is acted as a gain of the conversion module 11. Specifically, a driving current of the semiconductor optical amplifier 111 changes as the control signal Cs changes, and the gain of the semiconductor optical amplifier 111 changes as the driving current changes. Further referring to FIG. 2, FIG. 2 illustrates a relationship between the gain of the semiconductor optical amplifier 111 and an inputting power of the optical signal Ls under different driving currents. As can be seen from FIG. 2, if a larger (smaller) gain of the semiconductor optical amplifier 111 is desired, the driving current will be increased (decreased) according to the control signal Cs.

The optical band-pass filter 112 couples the semiconductor optical amplifier 111 to receive the amplified optical signal La and band-pass filter the amplified optical signal La to generate a filtered optical signal Lf. Specifically, the optical band-pass filter 112 is used to allow an optical signal having a wavelength to be detected to pass through, and filter out other optical signal having a wavelength not to be detected.

The photodetector 113 couples the optical band-pass filter 112 to receive the filtered optical signal Lf and photoelectrically convert the filtered optical signal Lf to the photocurrent Pc.

The signal generation module 12 receives an input signal Si indicating a preset output voltage swing, and electrically connects the photodetector 113 of the conversion module 11 to receive the photocurrent Pc. The signal generation module 12 provides a gain signal Gs indicating a total gain itself. The signal generation module 12 performs transimpedance and amplification on the photocurrent Pc according to the input signal Si to generate a voltage signal Vs, and generates a measurement signal Ms indicating an average optical power associated with the optical signal Ls according to the photocurrent Pc. The measurement signal Ms is acted as a received signal strength indication (RSSI) of the optical receiving device 1. The voltage signal Vs is an at least four level multilevel pulse amplitude modulation signal. In the present embodiment, the voltage signal Vs is a four level pulse amplitude modulation signal, but the present disclosure is not limited thereto. The signal generation module 12 includes a power detector 121, a transimpedance amplifier 122, a variable gain amplifier 123 and an automatic gain controller 124.

The power detector 121 electrically connects the photodetector 113 to detect the photocurrent Pc and generate the measurement signal Ms according to the photocurrent Pc.

The transimpedance amplifier 122 electrically connects the photodetector 113 to receive the photocurrent Pc and perform transimpedance and amplification on the photocurrent Pc to generate an amplified voltage signal Va.

The variable gain amplifier 123 receives a gain control signal Ac indicating a variable gain, and electrically connects the transimpedance amplifier 122 to receive the amplified voltage signal Va. The variable gain amplifier 123 adjusts a gain itself to the variable gain according to the gain control signal Ac and amplifies the amplified voltage signal Va to generate the voltage signal Vs.

The automatic gain controller 124 receives the input signal Si, and electrically connects the variable gain amplifier 123 to receive the voltage signal Vs. The automatic gain controller 124 provides the gain signal Gs, and the total gain indicated by the gain signal Gs is a sum of gains of the transimpedance amplifier 122 and the variable gain amplifier 123 (so the automatic gain controller 124 prestores a gain of the transimpedance amplifier 122, and the gain of the transimpedance amplifier 122 is constant). The automatic gain controller 124 performs a comparison between a voltage swing of the voltage signal Vs and the preset output voltage swing indicated by the input signal Si to adjust and generate the gain control signal Ac according to a result from the comparison and output the gain control signal Ac to the variable gain amplifier 123. For example, when the voltage swing of the voltage signal Vs is less than the preset output voltage swing, the automatic gain controller 124 promotes the variable gain of the gain control signal Ac, in turn the gain of the variable gain amplifier 123 increases with the gain control signal Ac under control of the gain control signal Ac, so that the voltage swing of the voltage signal Vs is gradually adjusted to be equal to the preset output voltage swing, so as to ensure an output magnitude of the voltage signal Vs to be conformed with the requirement of a post-stage circuit.

The control module 13 electrically connects the semiconductor optical amplifier 111 of the conversion module 11 and the power detector 121 and the automatic gain controller 124 of the signal generation module 12. The control module 13 is used to receive the input signal Si and output the input signal Si to the automatic gain controller 124, and further receive respectively the gain signal Gs from the automatic gain controller 124 and the measurement signal Ms from the power detector 121. The control module 13 generates the control signal Cs at least according to the input signal Si, the gain signal Gs and the measurement signal Ms and outputs the control signal Cs to the semiconductor optical amplifier 111 to adjust the gain of the semiconductor optical amplifier 111 of the conversion module 11, so that a dynamic range of the conversion module 11 changes as the gain of the semiconductor optical amplifier 111 changes.

Specifically, the control module 13 obtains an extinction ratio according to the input signal Si, the gain signal Gs, the measurement signal Ms, and an optical responsivity associated with the photoelectric conversion of the photodetector 113, the extinction ratio is used to judge whether the semiconductor optical amplifier 111 of the conversion module 11 is operated at a saturation region, and the control module 13 performs a comparison between the extinction ratio and a preset extinction ratio threshold to adjust and generate the control signal Cs according to a results from the comparison, so that when the extinction ratio is less than the preset extinction ratio threshold (that is, it represents that the semiconductor optical amplifier 111 is operated at the saturation region rather than a linear region, which will result in deformation of an eye diagram of the amplified optical signal La, in turn affect accuracy of demodulation of the post-stage circuit), the gain of the semiconductor optical amplifier 111 is lowered under control of the control signal Cs, which makes the extinction ratio after adjusted is greater than or is equal to the preset extinction ratio threshold, so as to make the semiconductor optical amplifier 111 be operated at the linear region. The extinction ratio may be obtained from the following equation (1);

$$ER = \frac{2 \times Pavg + Oma}{2 \times Pavg - Oma},\quad \text{equation (1)}$$

where, a parameter ER is the extinction ratio, a parameter Pavg is associated with a ratio of the measurement signal Ms and the optical responsivity, a parameter Oma is associated with a ratio of the input signal Si and the gain signal Gs.

The multilevel pulse amplitude demodulator 14 electrically connects the variable gain amplifier 123 to receive the voltage signal Vs and demodulate the voltage signal Vs to generate a data output Do.

Figure 3:
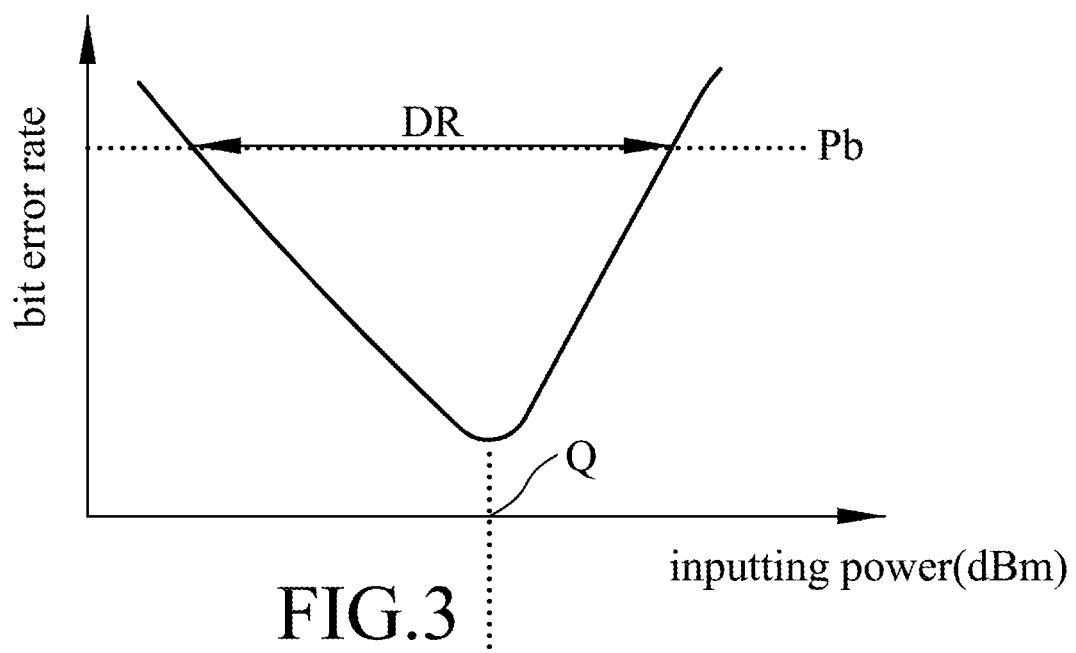
FIG. 3 is a simulation diagram illustrating a bit error rate changes with the inputting powers when the gain of the semiconductor optical amplifier of the first embodiment is constant.
Figure 4:
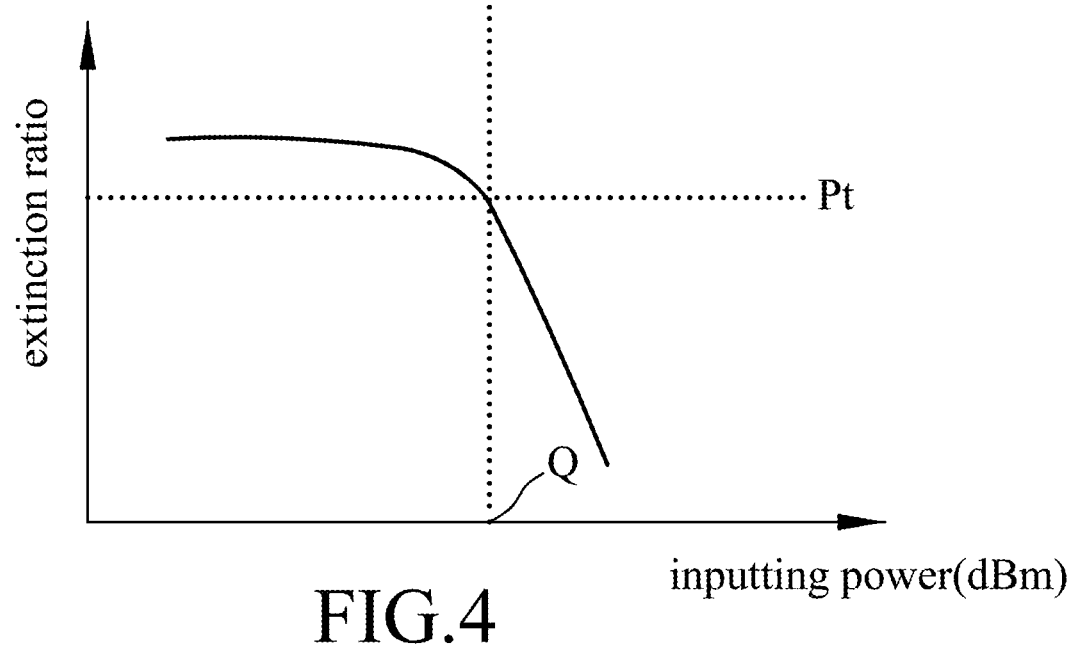
FIG. 4 is a simulation diagram illustrating an extinction ratio changes with the inputting powers when the gain of the semiconductor optical amplifier of the first embodiment is constant.

Referring to FIG. 3 and FIG. 4, FIG. 3 illustrates a relationship between a bit error rate (BER) of the data output Do and an inputting power of the optical signal Ls (which depends on a loss of the optical fiber 3) when the gain of the semiconductor optical amplifier 111 is constant. FIG. 4 illustrates a relationship between the extinction ratio ER and the inputting power of the optical signal Ls when the gain of the semiconductor optical amplifier 111 is constant. In FIG. 3, when the bit error rate is less than or equal to a preset bit error rate threshold Pb, the optical communication system 10 has a better link performance, and it is preferable to maximize a dynamic range of the optical receiving device 1 (that is, the dynamic range of the conversion module 11 represented by a symbol DR in FIG. 3) at various optical fiber transmission lengths. Because, as for a smaller inputting power of the optical signal Ls (that is, before a Q point), the bit error rate of the data output Do is limited by a noise of the optical communication system 10, but as for a larger inputting power of the optical signal Ls (that is, after the Q point), the link performance of the optical communication system 10 will become poor, and the bit error rate of the data output Do is limited by nonlinear distortion caused by the semiconductor optical amplifier 111 (that is, the semiconductor optical amplifier 111 is operated at the saturation region). Therefore, it may attain an inputting power range of the optical signal Ls of the best link performance by adjusting a starting position (that is, Q point) of the nonlinear distortion where the semiconductor optical amplifier 111 is operated, so as to maximize the dynamic range DR of the optical receiving device 1. Also, as shown in FIG. 4, as for linear operation of the amplified optical signal La, because the gain of the semiconductor optical amplifier 111 corresponding to a smaller inputting power of the optical signal Ls (that is, before the Q point) linearly changes, the extinction ratio ER is maintained constant. However, as for a larger inputting power of the optical signal Ls (that is, after the Q point), because the gain of the semiconductor optical amplifier 111 gradually becomes nonlinear (that is, the semiconductor optical amplifier 111 is operated at the saturation region), the extinction ratio ER begins to be less than the preset extinction ratio threshold. Therefore, the optical receiving device 1 of the present disclosure determines whether the semiconductor optical amplifier 111 is operated at the linear region by judging whether the extinction ratio ER is less than the preset extinction ratio threshold (that is, represented by a symbol Pt in FIG. 4), and when the extinction ratio ER is less than the preset extinction ratio threshold Pt, the optical receiving device 1 lowers the gain of the semiconductor optical amplifier 111 (that is, decreases the driving current of the semiconductor optical amplifier 111), to make the starting position Q of the nonlinear distortion where the semiconductor optical amplifier 111 is operated be postponed therewith, so that the dynamic range of the conversion module 11 increases therewith, a transfer distance of the optical signal Ls via the optical fiber 3 is less limited so as to promote link transmission performance.

Figure 5:
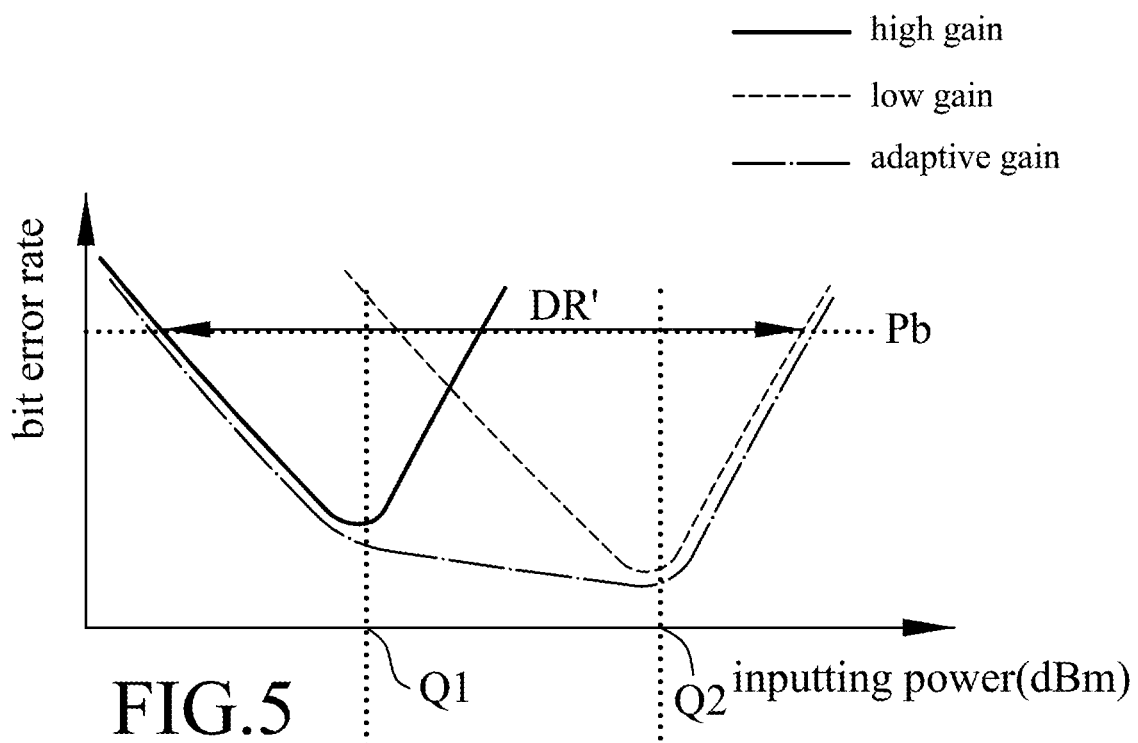
FIG. 5 is a simulation diagram illustrating the bit error rate changes with the inputting power when the gain of the semiconductor optical amplifier of the first embodiment is not constant.
Figure 6:
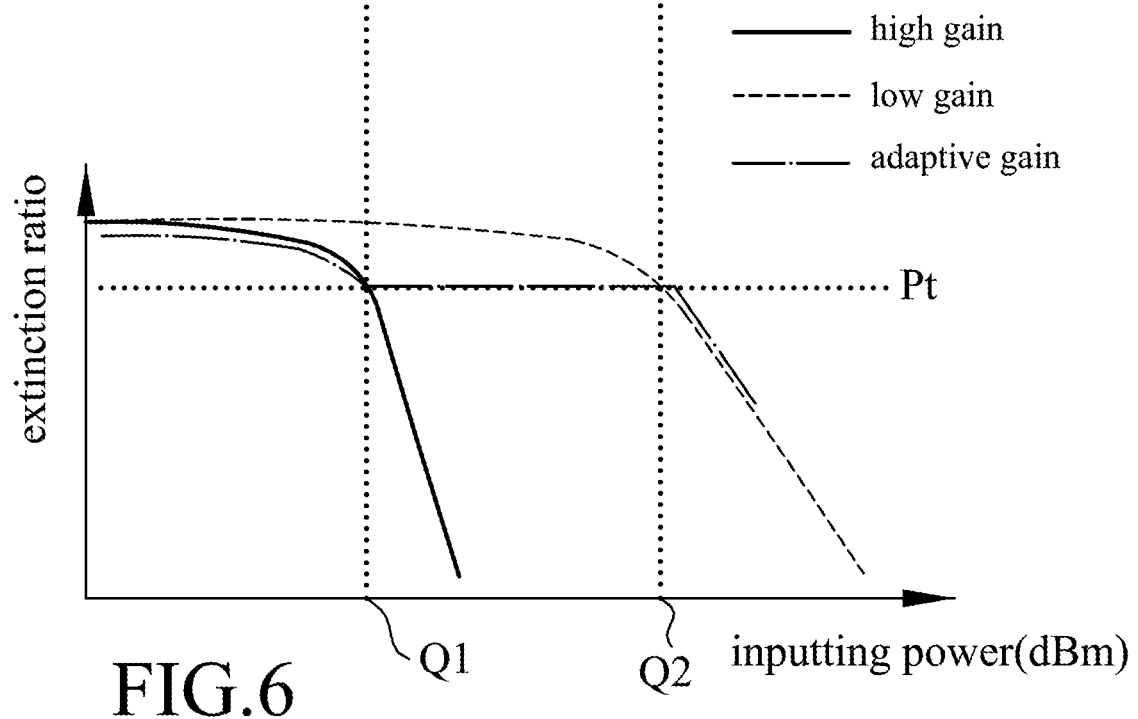
FIG. 6 is a simulation diagram illustrating the extinction ratio changes with the inputting power when the gain of the first embodiment of the semiconductor optical amplifier is not constant.

Referring to FIG. 5 and FIG. 6, FIG. 5 and FIG. 6 respectively differ from FIG. 3 and FIG. 4 in that, the gain of the semiconductor optical amplifier 111 is not constant. It can be seen from simulation diagrams of FIG. 5 and FIG. 6, when an inputting power of the optical signal Ls is greater than a first inputting power Q1, the extinction ratio ER begins to be less than the preset extinction ratio threshold Pt. Therefore, the control module 13 lowers the gain of the semiconductor optical amplifier 111, to make the semiconductor optical amplifier 111 continuously be operated at the linear region, and the semiconductor optical amplifier 111 from operated at the linear region turns to that the starting position of the saturation region is postponed therewith from a position where the first inputting power Q1 is located to a position where a second inputting power Q2 is located, in turn a dynamic range DR' of the conversion module 11 increases therewith, so the optical receiving device 1 of the present disclosure indeed has a preferable link performance.

It is noted that, in other embodiments, the optical receiving device 1 further includes an estimation module (not shown) which is electrically connected between the multilevel pulse amplitude demodulator 14 and the control module 13. The estimation module generates a estimating signal (which is associated with one of a bit error rate and a signal-to-noise ratio (SNR) of the optical signal Ls) according to the data output Do and outputs the estimating signal to the control module 13, so that the control module 13 adjusts the control signal Cs further according to the estimating signal.

Second Embodiment

Figure 7:
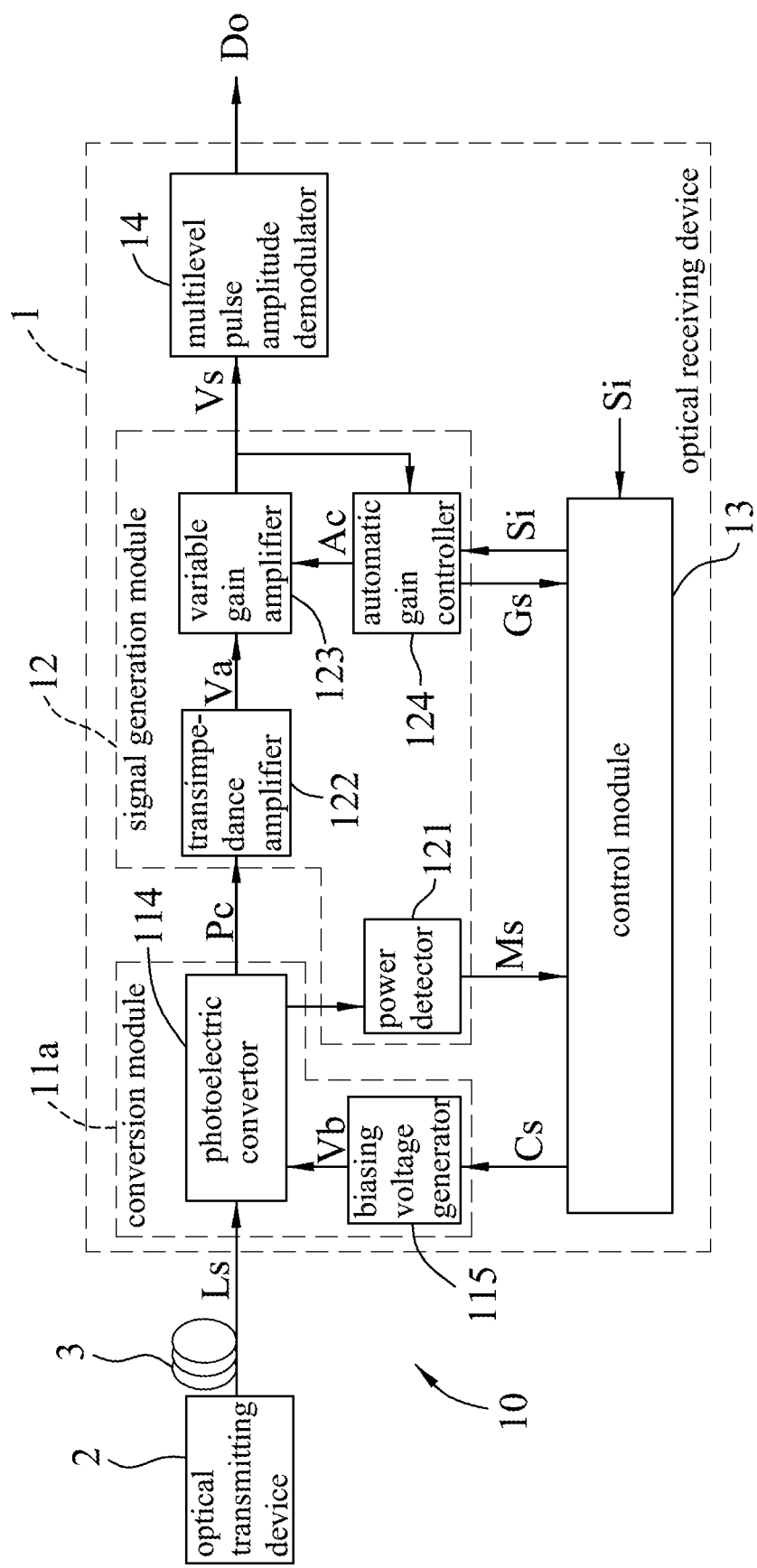
FIG. 7 is a block diagram illustrating a second embodiment of the optical receiving device of the present disclosure.

Referring to FIG. 7, a second embodiment of the optical receiving device 1 of the present disclosure is similar to the first embodiment, but differs from the first embodiment in that, in the second embodiment: (1) a conversion module 11a replaces the conversion module 11 of the first embodiment (see FIG. 1), the conversion module 11a includes a photoelectric convertor 114 and a biasing voltage generator 115; and (2) the power detector 121 electrically connects the photoelectric convertor 114 rather than the photodetector 113 (see FIG. 1).

The photoelectric convertor 114 receives a biasing voltage Vb, and is used to receive the optical signal Ls from the optical fiber 3. The photoelectric convertor 114 adjusts a gain itself according to the biasing voltage Vb (for example, when the biasing voltage Vb increases, the gain of the photoelectric convertor 114 increases therewith), and performs photoelectric conversion and amplification on the optical signal Ls to generate the photocurrent Pc. In the present embodiment, the gain of the photoelectric convertor 114 is acted as a gain of the conversion module 11a. The photoelectric convertor 114 is made of an avalanche photon diode.

The biasing voltage generator 115 is electrically connected between the photoelectric convertor 114 and the control module 13, receives the control signal Cs from the control module 13, and adjusts and generates the biasing voltage Vb according to the control signal Cs, and outputs the biasing voltage Vb to the photoelectric convertor 114.

It is noted that, the control module 13 obtains the extinction ratio ER at least according to the input signal Si, the gain signal Gs, the measurement signal Ms, and an optical responsivity associated with photoelectric conversion of the photoelectric convertor 114, and in the equation (1), the parameter Pavg is associated with the measurement signal Ms, the optical responsivity and the gain of the photoelectric convertor 114. An operation of the second embodiment of the optical receiving device 1 is similar to the operation of the first embodiment of the optical receiving device 1, so the description thereof is omitted.

Third Embodiment

Figure 8:
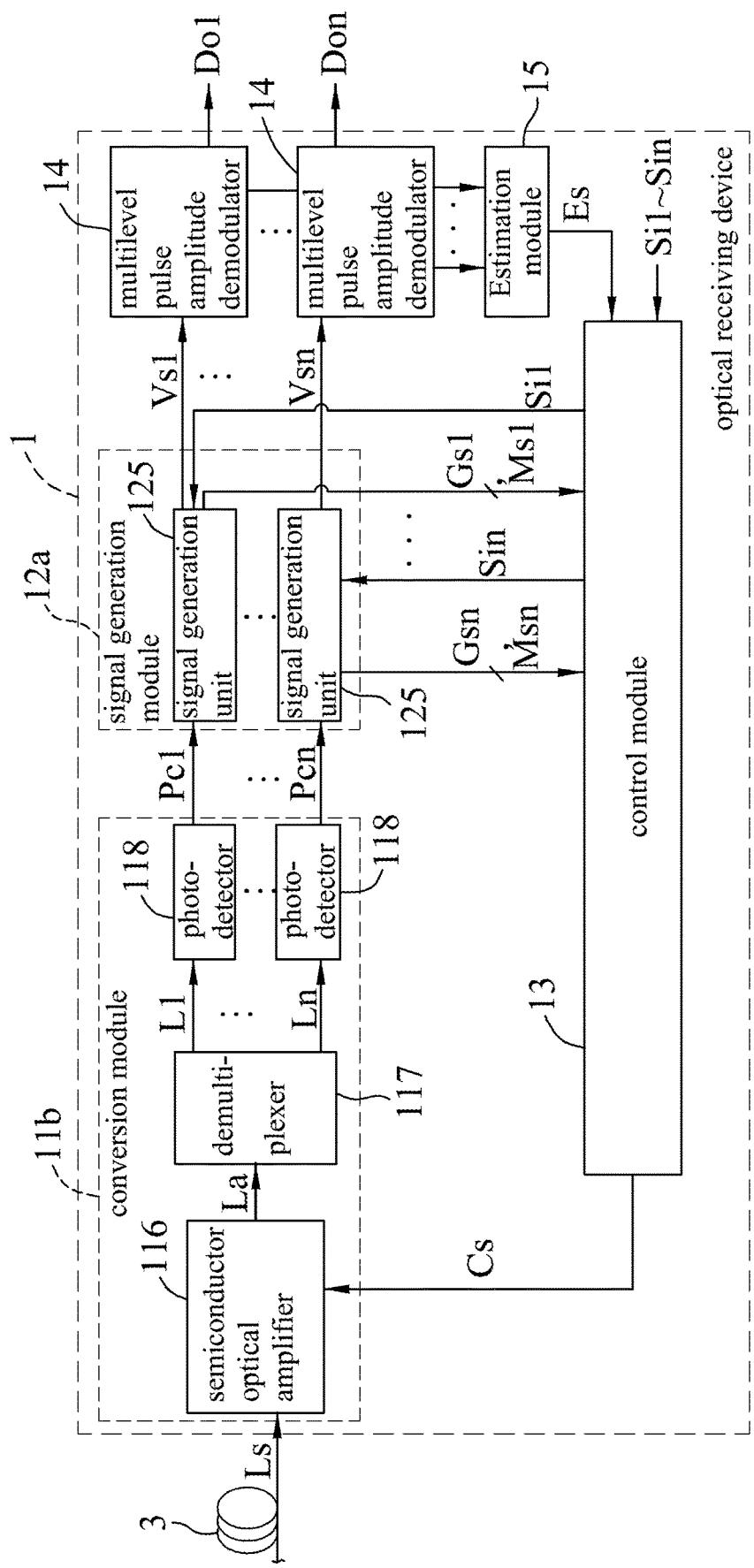
FIG. 8 is a block diagram illustrating a third embodiment of the optical receiving device of the present disclosure is used for another optical communication system.

Referring to FIG. 8, a third embodiment of the optical receiving device 1 of the present disclosure is used for another optical communication system, and the another optical communication system is a wavelength division multiplexing (WDM) transfer system. The third embodiment is similar to the first embodiment, the third embodiment differs from the first embodiment in that, in the third embodiment: (1) the optical signal Ls has a plurality of multilevel pulse amplitude modulation signals which each are an at least four level pulse amplitude modulation signal) (in the present embodiment, that each multilevel pulse amplitude modulation signal is a four level pulse amplitude modulation signal is taken as an example, but the present disclosure is not limited thereto); (2) a plurality of photocurrent parts Pc1-Pcn constitute the photocurrent Pc (see FIG. 1), a plurality of gain signal parts Gs1-Gsn constitute the gain signal Gs (see FIG. 1), a plurality of measurement signal parts Ms1-Msn constitute the measurement signal Ms, a plurality of voltage signal parts Vs1-Vsn constitute the voltage signal Vs; (3) a plurality of input signal parts Si1-Sin constitute the input signal Si (see FIG. 1), the plurality of input signal parts Si1-Sin respectively indicate a plurality of preset output voltage swing parts, the plurality of preset output voltage swing parts constitute the preset output voltage swing indicated by the input signal Si; (4) a conversion module 11b and a signal generation module 12a respectively replace the conversion module 11 and the signal generation module 12 of the first embodiment (see FIG. 1); and (5) a plurality of multilevel pulse amplitude demodulators 14 and an estimation module 15 are further included.

In the present embodiment, the conversion module 11b includes a semiconductor optical amplifier 116, a demultiplexer 117 and a plurality of photodetectors 118. It is noted that, because an operation of the semiconductor optical amplifier 116 is similar to the operation of the semiconductor optical amplifier 111 of FIG. 1, the description thereof is omitted.

The demultiplexer 117 couples the semiconductor optical amplifier 116 to receive the amplified optical signal La and demultiplex the amplified optical signal La to generate a plurality of adjusting optical signals L1-Ln which are respectively associated with the plurality of multilevel pulse amplitude modulation signals of the optical signal Ls.

The plurality of photodetectors 118 couple the demultiplexer 117 to respectively receive the plurality of adjusting optical signals L1-Ln and respectively photoelectrically convert the plurality of adjusting optical signals L1-Ln to the plurality of photocurrent part Pc1-Pcn correspondingly.

In the present embodiment, the signal generation module 12a includes a plurality of signal generation units 125. It is noted that, because the detailed components and the operation of each signal generation unit 125 are similar to those of the signal generation module 12 of FIG. 1, only signal generation unit 125 in the top most is taken as an example and simply described.

The signal generation unit 125 electrically connects the control module 13 to receive the corresponding input signal part Si1, and electrically connects the corresponding photodetector 118 to receive the corresponding photocurrent part Pc1. The signal generation unit 125 provides the corresponding gain signal part Gs1, and amplifies the corresponding photocurrent part Pc1 according to the corresponding input signal part Si1 to generate the corresponding voltage signal part Vs1, and generates the corresponding measurement signal part Ms1 indicating an average optical power of the corresponding photocurrent part Pc1 according to the corresponding photocurrent part Pc1.

The plurality of multilevel pulse amplitude demodulators 14 respectively electrically connect the plurality of signal generation units 125 to respectively receive the plurality of voltage signal parts Vs1-Vsn, and demodulate the plurality of voltage signal parts Vs1-Vsn respectively to respectively generate a plurality of data outputs Do1-Don.

The estimation module 15 electrically connects the control module 13, and electrically connects the plurality of multilevel pulse amplitude demodulators 14 to receive the plurality of data outputs Do1-Don, and generates an estimating signal Es according to the plurality of data outputs Do1-Don and outputs the estimating signal Es to the control module 13, so that the control module 13 adjusts the control signal Cs further according to the estimating signal Es. In the present embodiment, the estimating signal Es is associated with one of the bit error rate and the signal-to-noise ratio of the optical signal Ls.

It is noted that, an operation of the third embodiment of the optical receiving device 1 and is similar to the operation of the first embodiment of the optical receiving device 1, the description thereof is omitted. Moreover, manners that the control module 13 adjusts the control signal Cs are: (1) obtaining a plurality of extinction ratios at least according to the plurality of input signal parts Si1-Sin, the plurality of gain signal parts Gs1-Gsn and the plurality of measurement signal parts Ms1-Msn to adjust the control signal Cs; (2) obtaining the extinction ratio only according to the input signal part, the gain signal part and the measurement signal part correspondingly outputted by one of signal generation units 125 and a corresponding optical responsivity to adjust the control signal Cs; (3) adjusting the control signal Cs only according to the estimating signal Es; and (4) comprehensively considering the extinction ratio from the manner (2) and the estimating signal Es from the manner (3) to adjust the control signal Cs, but the present disclosure is not limited thereto.

In conclusion, by cooperation between the signal generation module 12 (12a) and the control module 13 inside the optical receiving device 1 itself, the optical receiving device 1 of the present disclosure knows whether the semiconductor optical amplifier 111 (116) or the photoelectric convertor 114 is operated at the saturation region, and the control module 13 will perform corresponding gain control on the semiconductor optical amplifier 111 (116) or the photoelectric convertor 114 to avoid the problem that the semiconductor optical amplifier 111 (116) or the photoelectric convertor 114 is operated at the saturation region. As such, the optical communication system which employs the optical receiving device 1 of the present disclosure may omit the adjustable optical attenuator, the optical splitter and the optical detector which are additionally provided in the existing optical communication system. Therefore, the optical communication system which employs the optical receiving device 1 of the present disclosure has a smaller volume and a lower cost in comparison with the existing optical communication system. Moreover, by adjusting the gain of the semiconductor optical amplifier 111 (116) or the photoelectric convertor 114, the dynamic range of the conversion module 11 (11a, 11b) may be further increased therewith, so that the transfer distance of the optical signal Ls via the optical fiber 3 is less limited, in turn link performance is promoted.

However, the above description is only for the embodiments of the present disclosure, and it is not intended to limit the implementing scope of the present disclosure, and the simple equivalent changes and modifications made according to the claims and the contents of the specification are still included in the scope of the present disclosure.

What is claimed is:

1. An optical receiving device, comprising:
   an optical amplifier that generates an amplified optical signal from an optical signal;
   a photodetector that is communicatively coupled to the optical amplifier and generates a photocurrent from the amplified optical signal or a signal derived therefrom;
   an automatic gain controller that (i) is electrically connected to the photodetector and receives the photocurrent, (ii) receives (a) an input signal indicating a preset output voltage swing and (b) a voltage signal, and, (iii) outputs a gain signal, and (iv) outputs a gain control signal that depends on the input signal and the voltage signal;
   a transimpedance amplifier that is electrically connected to the photodetector and amplifies the photocurrent to yield an amplified voltage signal;
   a variable gain amplifier that (i) is electrically connected to the transimpedance amplifier and the automatic gain controller and (ii) generates the voltage signal (Vs) according to the amplified voltage signal and the gain control signal;
   a power detector that (i) is electrically connected to the photodetector such that the transimpedance amplifier and the power detector are connected to the photodetector in parallel, and (ii) generates, a measurement signal indicating an average optical power associated with the optical signal according to the photocurrent; and
   a controller that (i) is electrically connected to each of the optical amplifier, the automatic gain controller, and (ii) controls a gain of the optical amplifier by outputting, to the optical amplifier, a control signal that depends on each of the gain signal, the input signal, and the measurement signal.

2. The optical receiving device of claim 1, further comprising:
   an optical band-pass filter, coupled to the optical amplifier, that band-pass filters the amplified optical signal to generate a filtered optical signal,
   such that the photodetector generates the photocurrent from the filtered optical signal.

3. The optical receiving device of claim 1, wherein the optical amplifier includes:
   a photoelectric convertor which receives a biasing voltage, and is used to receive the optical signal, the photoelectric convertor adjusts a gain itself according to the biasing voltage and performs photoelectric conversion and amplification on the optical signal to generate the photocurrent, the gain of the photoelectric convertor is acted as the gain of the optical amplifier, and
   a biasing voltage generator which is electrically connected between the photoelectric convertor and the control module, receives the control signal from the control module, and adjusts and generates the biasing voltage according to the control signal, and outputs the biasing voltage to the photoelectric convertor.

4. The optical receiving device of claim 3, wherein the photoelectric convertor is made of an avalanche photon diode.

5. The optical receiving device of claim 1, wherein the optical signal and the voltage signal each are an at least four level multilevel pulse amplitude modulation signal.

6. The optical receiving device of claim 1, further comprising:
   a multilevel pulse amplitude demodulator electrically connected to the variable gain amplifier.

7. The optical receiving device of claim 1, wherein the optical signal has a plurality of multilevel pulse amplitude modulation signals, the photocurrent has a plurality of photocurrent parts, and further comprising:
   a demultiplexer which couples the optical amplifier to receive the amplified optical signal and demultiplex the amplified optical signal to generate a plurality of adjusting optical signals respectively associated with the plurality of multilevel pulse amplitude modulation signals, and
   a plurality of photodetectors, including the photodetector, which couple the demultiplexer to respectively receive the plurality of adjusting optical signals and respectively photoelectrically convert the plurality of adjusting optical signals to the plurality of photocurrent parts correspondingly.

8. The optical receiving device of claim 7, wherein the input signal has a plurality of input signal parts which each indicate a respective one of a plurality of preset output voltage swing parts of the preset output voltage swing, the gain signal has a plurality of gain signal parts, the voltage signal has a plurality of voltage signal parts, and further comprising:
   a plurality of signal generation units, each of which:
      includes a respective additional automatic gain controller, a respective additional transimpedance amplifier, a respective additional variable gain amplifier, and a respective additional power detector;
      electrically connects the control module to receive the corresponding input signal part;
      electrically connects the corresponding photodetector to receive the corresponding photocurrent part;
      provides the corresponding gain signal part and amplifies the corresponding photocurrent part according to the corresponding input signal part to generate the corresponding voltage signal part; and generates a measurement signal part indicating an average optical power of the corresponding photocurrent part according to the corresponding photocurrent part, wherein a plurality of measurement signal parts constitutes the measurement signal.

9. An optical receiving device comprising:

an optical amplifier that generates an amplified optical signal from an optical signal that includes a plurality of multilevel pulse amplitude modulation signals;

a photodetector that is communicatively coupled to the optical amplifier and generates, from the amplified optical signal or a signal derived therefrom, a photocurrent having a plurality of photocurrent parts;

a plurality of signal generation units, each of which includes a respective: automatic gain controller that (i) is electrically connected to the photodetector and receives the photocurrent, (ii) receives (a) an input signal indicating a preset output voltage swing and (b) a voltage signal, (iii) outputs a gain signal, and (iv) outputs a gain control signal that depends on the input signal and the voltage signal;

transimpedance amplifier that is electrically connected to the photodetector and amplifies the photocurrent to yield an amplified voltage signal;

variable gain amplifier that (i) is electrically connected to the transimpedance amplifier and the automatic gain controller and (ii) generates the voltage signal (Vs) according to amplified voltage signal and the gain control signal;

power detector that (i) is electrically connected to the photodetector such that the transimpedance amplifier and the power detector are connected to the photodetector in parallel, and (ii) generates a measurement signal indicating an average optical power associated with the optical signal according to the photocurrent;

a controller that (i) is electrically connected to each of the optical amplifier, the automatic gain controller, and the power detector, and (ii) controls a gain of the optical amplifier by outputting, to the optical amplifier, a control signal that depends on each of the gain signal, the input signal, and the measurement signal;

a demultiplexer which couples the optical amplifier to receive the amplified optical signal and demultiplex the amplified optical signal to generate a plurality of adjusting optical signals respectively associated with the plurality of multilevel pulse amplitude modulation signals; and a plurality of photodetectors, including the photodetector, which couple the demultiplexer to respectively receive the plurality of adjusting optical signals and respectively photoelectrically convert the plurality of adjusting optical signals to the plurality of photocurrent parts correspondingly, wherein each of the plurality of signal generation units:

electrically connects the control module to receive the corresponding input signal part;

electrically connects the corresponding photodetector to receive the corresponding photocurrent part;

provides the corresponding gain signal part and amplifies the corresponding photocurrent part according to the corresponding input signal part to generate the corresponding voltage signal part; and generates a measurement signal part indicating an average optical power of the corresponding photocurrent part according to the corresponding photocurrent part, wherein a plurality of measurement signal parts constitutes the measurement signal.

* * * * *